(12) United States Patent
Wang et al.

(10) Patent No.: US 9,564,569 B1
(45) Date of Patent: Feb. 7, 2017

(54) HERMETIC SOLUTION FOR THERMAL AND OPTICAL SENSOR-IN-PACKAGE

(71) Applicant: Maxim Integrated Products, Inc., Sunnyvale, CA (US)

(72) Inventors: Ken Wang, Milpitas, CA (US); Jerome C. Bhat, Palo Alto, CA (US); Tian Tian, Fremont, CA (US); Seshasayee Ankireddi, San Jose, CA (US); Kumar Nagaranjan, Cupertino, CA (US); Seshasayee Gaddamraja, Santa Clara, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/977,932

(22) Filed: Dec. 22, 2015

Related U.S. Application Data

(60) Provisional application No. 62/191,035, filed on Jul. 10, 2015.

(51) Int. Cl.
*H01L 25/16* (2006.01)
*H01L 35/02* (2006.01)
*H01L 31/12* (2006.01)
*H01L 35/34* (2006.01)
*H01L 31/18* (2006.01)
*H01L 31/0203* (2014.01)

(52) U.S. Cl.
CPC ............ *H01L 35/02* (2013.01); *H01L 25/165* (2013.01); *H01L 25/167* (2013.01); *H01L 31/0203* (2013.01); *H01L 31/12* (2013.01); *H01L 31/18* (2013.01); *H01L 35/34* (2013.01)

(58) Field of Classification Search
CPC ............ H01L 2023/4031; H01L 25/167; G01S 7/4813
See application file for complete search history.

(56) References Cited

U.S. PATENT DOCUMENTS

2006/0038129 A1* 2/2006 Watanabe .................. G01J 5/12 250/338.1
2014/0231635 A1* 8/2014 Kerness ................ G01S 17/026 250/226

* cited by examiner

*Primary Examiner* — Matthew Reames
(74) *Attorney, Agent, or Firm* — Advent, LLP (57) ABSTRACT

A sensor-in-package device, a process for fabricating a hermetically-sealed sensor-in-package device, and a process for fabricating a hermetically-sealed sensor-in-package device with a pre-assembled hat that employ example techniques in accordance with the present disclosure are described herein. In an implementation, the sensor-in-package device includes a substrate; at least one thermopile, at least one photodetector, at least one light-emitting diode, an ultraviolet light sensor, and a pre-assembled hat disposed on the first side of the substrate, where the pre-assembled hat includes a body; a first lid; and a second lid; where the body, the substrate, and the first lid define a thermopile cavity that houses the at least one thermopile, and where the body, the substrate, and the second lid define an optical cavity that houses at least one of the at least one photodetector, the at least one light-emitting diode, or the ultraviolet light sensor.

20 Claims, 11 Drawing Sheets

HERMETIC SOLUTION FOR THERMAL AND OPTICAL SENSOR-IN-PACKAGE

BACKGROUND

Ceramic materials and substrates are widely used for packaging materials because of their high mechanical strength and desirable electrical properties. Often, interconnect circuit boards and other electronic devices, such as sensors, include a ceramic package or a ceramic substrate. These ceramic packages and substrates can be suitable for use in sensors due to a high modulus of elasticity and low coefficient of thermal expansion of the ceramic materials. Hermetic ceramic packaging can be used for applications requiring high performance and high reliability. This type of packaging can often withstand higher temperatures than plastic packaging.

SUMMARY

A sensor-in-package device, a process for fabricating a hermetically-sealed sensor-in-package device, and a process for fabricating a hermetically-sealed sensor-in-package device with a pre-assembled hat that employ example techniques in accordance with the present disclosure are described herein. In an implementation, the sensor-in-package device includes a substrate having a first side and a second side; at least one thermopile disposed on the first side of the substrate; at least one photodetector disposed on the first side of the substrate; at least one light-emitting diode disposed on the first side of the substrate; an ultraviolet light sensor disposed on the first side of the substrate; and a pre-assembled hat disposed on the first side of the substrate, where the pre-assembled hat includes a body; a first lid; and a second lid; where the body, the substrate, and the first lid define a thermopile cavity that houses the at least one thermopile, and where the body, the substrate, and the second lid define an optical cavity that houses at least one of the at least one photodetector, the at least one light-emitting diode, or the ultraviolet light sensor.

In an implementation, the process for fabricating a hermetically-sealed sensor-in-package device includes placing at least one die and at least one thermopile on a first side of a ceramic substrate in the ceramic package, where the ceramic package includes a ceramic body and the ceramic substrate; hermetically-sealing a silicon lid on a first portion of the ceramic body, where the ceramic body, the ceramic substrate, and the silicon lid define a hermetically-sealed thermopile cavity that houses the at least one thermopile; hermetically-sealing a glass lid on a second portion of the ceramic body, where the ceramic body, the ceramic substrate, and the glass lid define a hermetically-sealed optical cavity that houses the at least one die; and placing at least one of at least one surface mount device, an application-specific integrated circuit, or at least one solder connection on a second side of the ceramic substrate.

In an implementation, a fabricating a hermetically-sealed sensor-in-package device with a pre-assembled hat includes placing at least one of an application-specific integrated circuit or a surface mount device on a first side of a ceramic substrate; placing at least one of at least one thermopile, at least one photodetector, at least one light-emitting diode, or an ultraviolet light sensor on the second side of the ceramic substrate; placing the pre-assembled hat on the second side of the ceramic substrate using a vacuum furnace, where the pre-assembled hat includes a ceramic body; a silicon lid disposed on a first portion of the ceramic body, where the silicon lid, the ceramic body, and the ceramic substrate form a hermetically-sealed thermopile cavity; and a glass lid disposed on a second portion of the ceramic body, where the silicon lid, the ceramic body, and the ceramic substrate form a hermetically-sealed optical cavity; and forming at least one solder connection on the first side of the ceramic substrate.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Hermetically sealed packages include a package with a hermetic seal designed to keep components of the package isolated and protected from harsh conditions. For example, the hermetic seal can prevent gasses and liquids from entering the package cavity where electrical components, such as a die, are disposed.

Some ceramic packages utilize hermetic sealing. In these instances, a hermetic seal can be formed by melting lid glass over the base of the ceramic package or by soldering or welding a metal lid to a metallized seal ring. However, traditional hermetic ceramic packaging is often bulky and tall and must be fabricating using multiple process steps (e.g., forming the package base, placing die, sensors, and other components in the package base, and placing a lid on the package).

Accordingly, a sensor-in-package device, a process for fabricating a hermetically-sealed sensor-in-package device, and a process for fabricating a hermetically-sealed sensor-in-package device with a pre-assembled hat that employ example techniques in accordance with the present disclosure are described herein. In an implementation, the sensor-in-package device includes a substrate having a first side and a second side; at least one thermopile disposed on the first side of the substrate; at least one photodetector disposed on the first side of the substrate; at least one light-emitting diode disposed on the first side of the substrate; an ultraviolet light sensor disposed on the first side of the substrate; and a pre-assembled hat disposed on the first side of the substrate, where the pre-assembled hat includes a body; a first lid; and a second lid; where the body, the substrate, and the first lid define a thermopile cavity that houses the at least one thermopile, and where the body, the substrate, and the second lid define an optical cavity that houses at least one of the at least one photodetector, the at least one light-emitting diode, or the ultraviolet light sensor.

In an implementation, the process for fabricating a hermetically-sealed sensor-in-package device includes placing at least one die and at least one thermopile on a first side of a ceramic substrate in the ceramic package, where the ceramic package includes a ceramic body and the ceramic substrate; hermetically-sealing a silicon lid on a first portion of the ceramic body, where the ceramic body, the ceramic substrate, and the silicon lid define a hermetically-sealed thermopile cavity that houses the at least one thermopile; hermetically-sealing a glass lid on a second portion of the ceramic body, where the ceramic body, the ceramic substrate, and the glass lid define a hermetically-sealed optical cavity that houses the at least one die; and placing at least one of at least one surface mount device, an application-specific integrated circuit, or at least one solder connection on a second side of the ceramic substrate.

In an implementation, a fabricating a hermetically-sealed sensor-in-package device with a pre-assembled hat includes placing at least one of an application-specific integrated circuit or a surface mount device on a first side of a ceramic substrate; placing at least one of at least one thermopile, at least one photodetector, at least one light-emitting diode, or an ultraviolet light sensor on the second side of the ceramic substrate; placing the pre-assembled hat on the second side of the ceramic substrate using a vacuum furnace, where the pre-assembled hat includes a ceramic body; a silicon lid disposed on a first portion of the ceramic body, where the silicon lid, the ceramic body, and the ceramic substrate form a hermetically-sealed thermopile cavity; and a glass lid disposed on a second portion of the ceramic body, where the silicon lid, the ceramic body, and the ceramic substrate form a hermetically-sealed optical cavity; and forming at least one solder connection on the first side of the ceramic substrate.

The technology herein can utilize existing flat ceramic and a pre-assembled hat to achieve a hermetic and an optical solution in one process step. Additionally, this approach does not require specialized light-emitting diode or sensor designs. With this approach, multiple sensing functionality can be integrated into a single package and/or module with a smaller form factor.

Example Implementations

FIGS. 1A through 1I illustrate a sensor-in-package device 100 in accordance with an example implementation of the present disclosure. The sensor-in-package device 100 can include a hermetic solution for sensor-in-package devices that also includes miniaturization and a smaller form factor.

In implementations, the sensor-in-package device 100 can include a substrate 102. In embodiments, the substrate 102 can include materials suitable for functioning as a substrate, such as silicon, ceramic, etc. The substrate 102 can include a first side 104 and a second side 106. In embodiments and as further described below, sensor-in-package device 100 components can be placed on both the first side 104 and the second side 106 of the substrate 102. In some implementations, the substrate 102 can include a substantially flat substrate 102. In some specific instances, the substrate 102 can be pre-singulation and configured to be segmented into individual packages subsequent to some processing steps. In some specific instances, the substrate 102 can be pre-singulated, where components can be subsequently added to the segmented substrate 102.

In implementations, the sensor-in-package device 100 includes a body 108. A body 108 can include walls, sidewalls, dividers, supports, and/or structure that are coupled together to form a frame. In some embodiments, the body 108 may include materials, such as silicon and/or ceramic. For example, the body 108 can include a set of walls and outside edges of the sensor-in-package device 100. In some embodiments, the body 108 can be formed and/or placed on the substrate 102 prior to placing a die or other component on the substrate 102. In some embodiments, the body 108 can be formed and/or placed on the substrate 102 subsequent to placing a die or other component on the substrate 102 (e.g., when placing a pre-assembled hat, which is described below). Moreover, the body 108 may include electrical interconnections, such as vias, wiring (e.g., connections for a wire bond), redistribution layer(s), and/or other means for electrical connection.

Additionally, the body 108 can include a metallized track 136 disposed on the walls and/or dividers such that a lid and/or covering can be attached and/or coupled (e.g., melting, soldering, brazing, welding, etc.) to the metallized track 136 for providing a hermetic seal. The metallized track 136 can include metal, metal alloys, and/or a composite material configured to provide a hermetic seal, provide thermal conductivity, thermal expansion, and/or a light weight. One example of a material that can be used for the metallized track 136 can include a solder (e.g., a gold-tin solder (AuSn), SnAgCu). In some instances, the metallized track 136 can be disposed on portions of the body 108 configured to physically contact a first lid 120, a second lid 122, and/or the substrate 102.

Additionally, the body 108 can include a step 134 and/or a raised portion 140. For example, FIGS. 1E and 1F illustrate an embodiment where a body 108 includes a step 134. The step 134 can include a portion of the body 108 and/or at least one wall of the body 108 that extends generally away from the wall. In the embodiment shown in FIGS. 1E and 1F, the body 108 includes a first step 134 that extends from a wall of the body 108 into an area configured to include a thermopile cavity 124 and proximate to a resistance temperature detector 138 and includes a second step 134 that extends from a wall opposite the first step 134 but in a similar fashion. In this embodiment, the first and second steps 134 only extend partially the length of the wall (e.g., from the wall bottom, or portion of the wall configured to couple to the substrate 102, to the wall top, or portion of the wall configured to be distal from the substrate 102). However, it is contemplated that the step 134 may include other configurations, such as extending from one wall to another wall and/or extending from the bottom of a wall to the top of the same and/or a different wall. In the embodiment shown in FIGS. 1G and 1H, the body 108 includes a raised portion 140, which may include a wall that extends from a second wall to a third wall and extends at least partially the length of the second and/or third walls (e.g., from the wall bottom, or portion of the wall configured to couple to the substrate 102, to the wall top, or portion of the wall configured to be distal from the substrate 102). In this embodiment, a device (e.g., a resistance temperature detector 138) may be disposed on the raised portion 140 and may be electrically coupled to the sensor-in-package device 100 using electrical interconnections within the body 108.

Figure 1A:
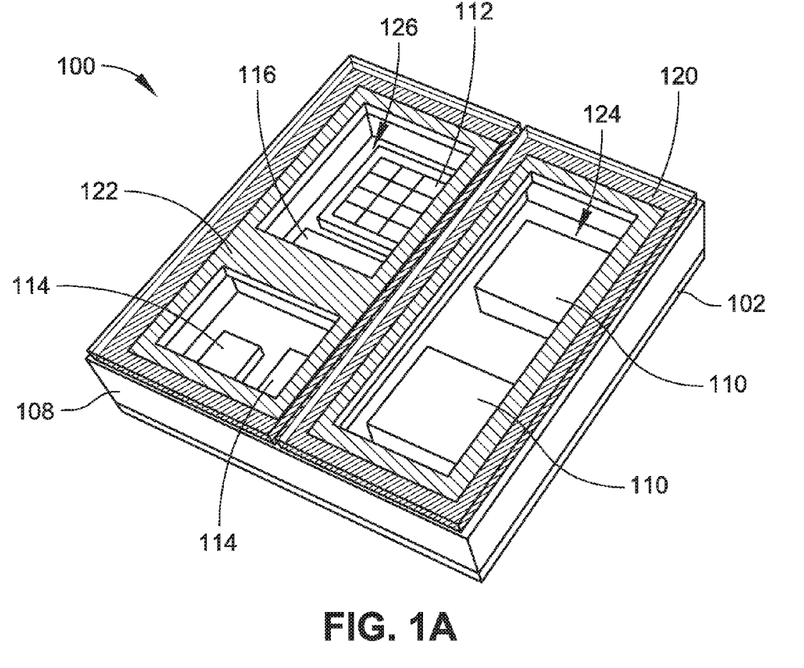
FIG. 1A is an isometric view illustrating an embodiment of a ceramic package that includes a hermetic seal, in accordance with an example implementation of the present disclosure.
Figure 1B:
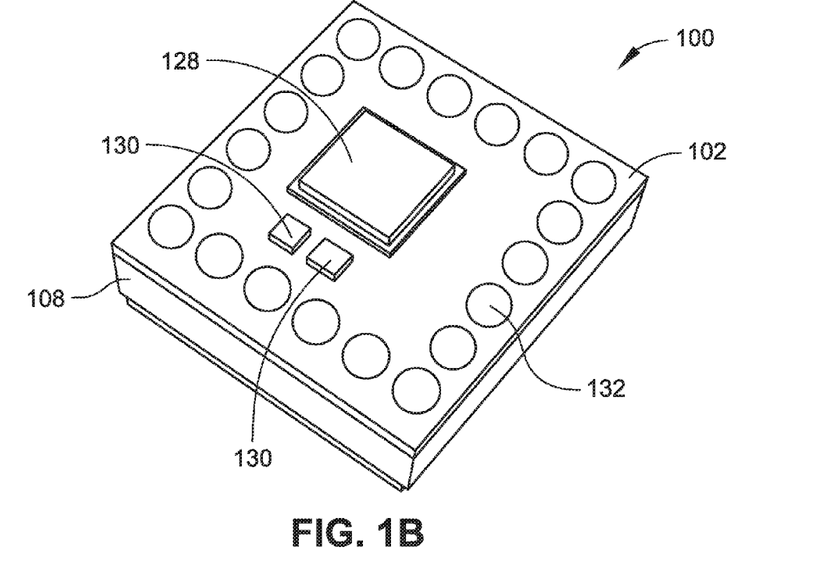
FIG. 1B is an isometric view illustrating an embodiment of a ceramic package that includes a hermetic seal, in accordance with an example implementation of the present disclosure.
Figure 1C:
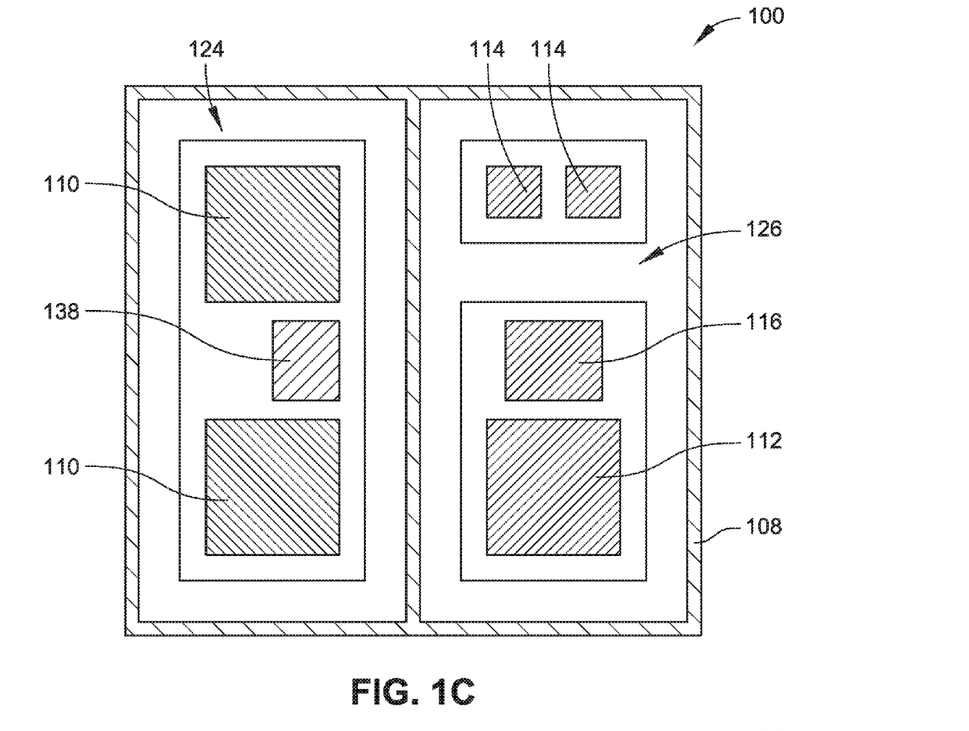
FIG. 1C is a top plan view illustrating an embodiment of a ceramic package that utilizes a hermetic seal, in accordance with an example implementation of the present disclosure.
Figure 1D:
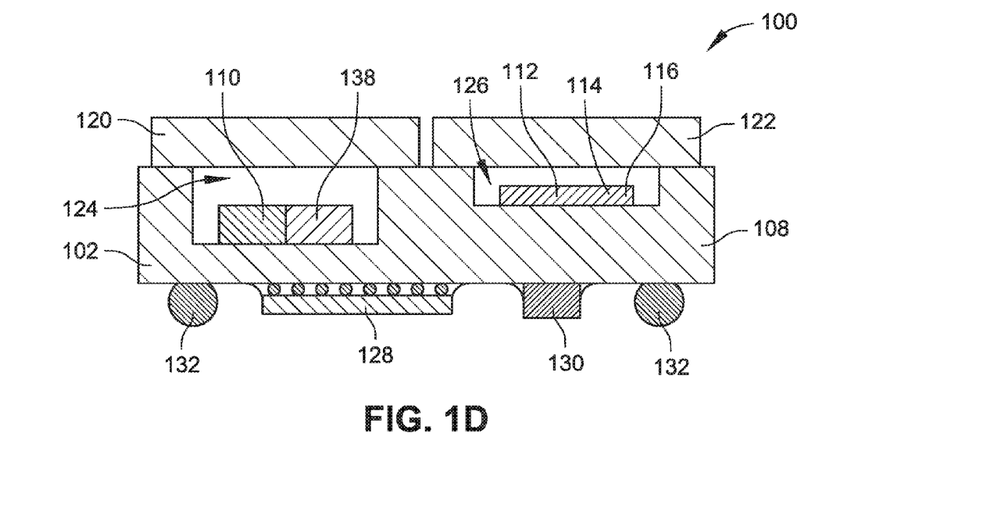
FIG. 1D is a partial side cross-sectional view illustrating an embodiment of a ceramic package that utilizes a hermetic seal, in accordance with an example implementation of the present disclosure.
Figure 1E:
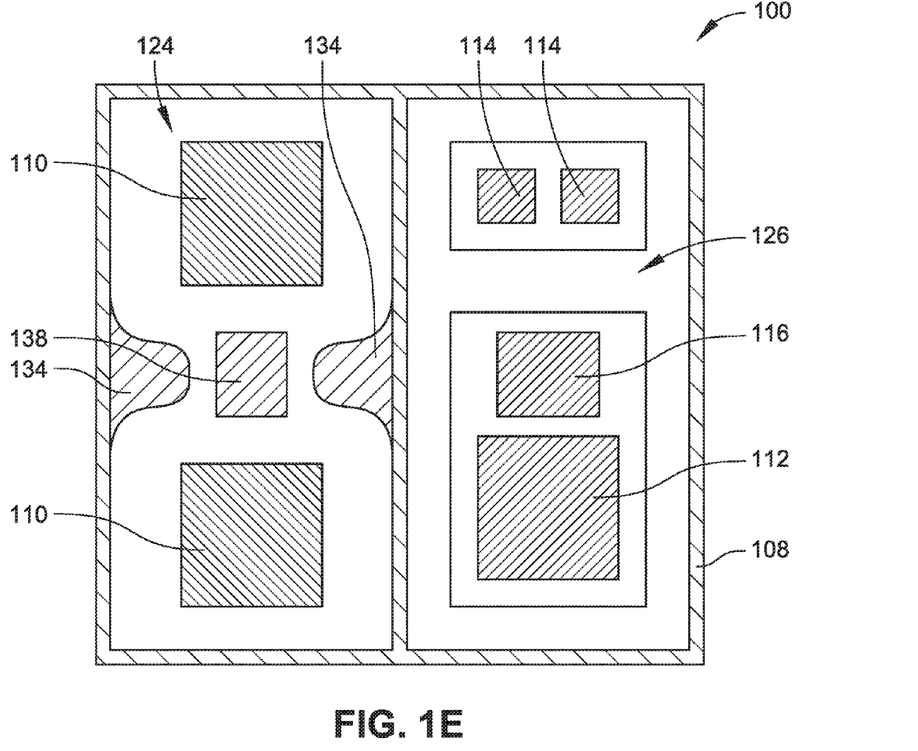
FIG. 1E is a top plan view illustrating an embodiment of a ceramic package that utilizes a hermetic seal, in accordance with an example implementation of the present disclosure.
Figure 1F:
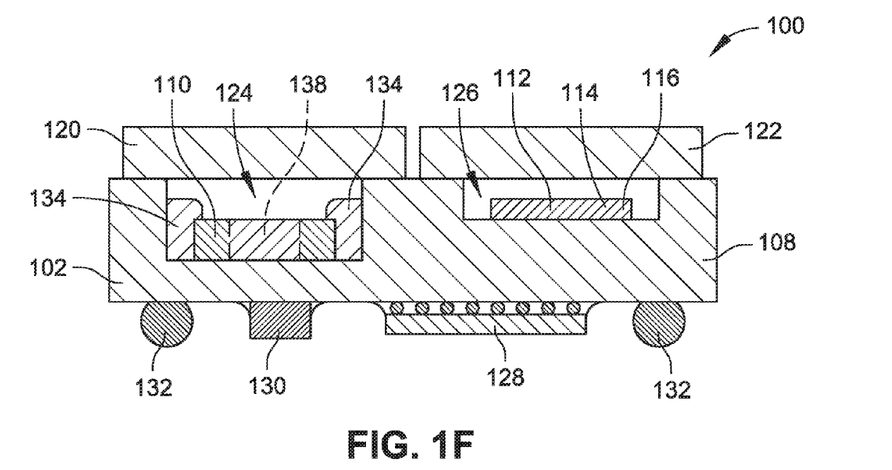
FIG. 1F is a partial side cross-sectional view illustrating an embodiment of a ceramic package that utilizes a hermetic seal, in accordance with an example implementation of the present disclosure.
Figure 1G:
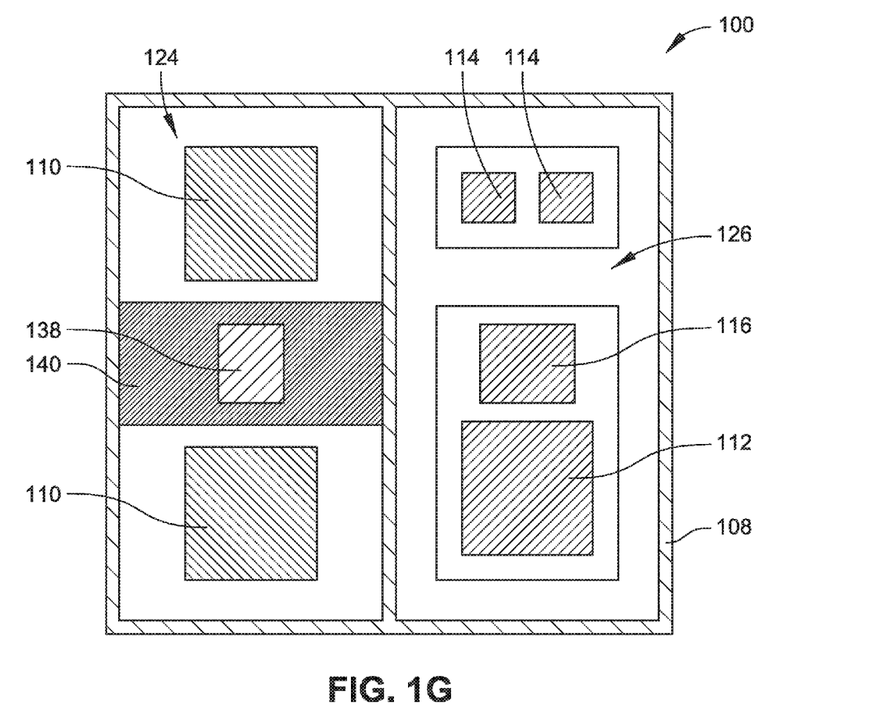
FIG. 1G is a top plan view illustrating an embodiment of a ceramic package that utilizes a hermetic seal, in accordance with an example implementation of the present disclosure.
Figure 1H:
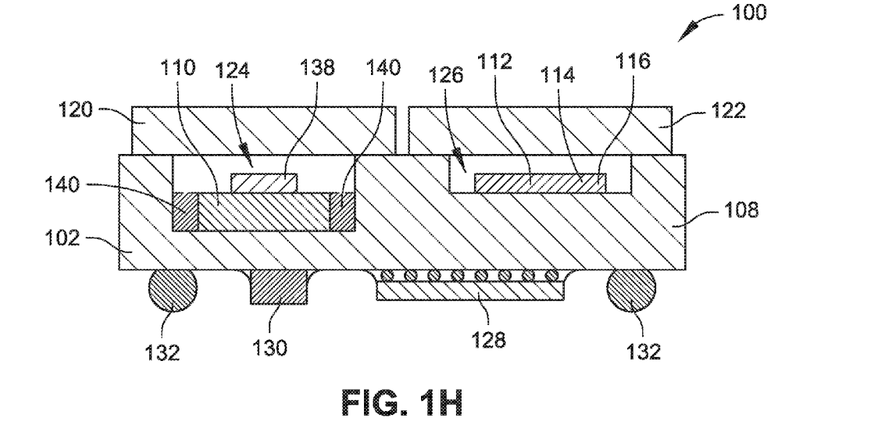
FIG. 1H is a partial side cross-sectional view illustrating an embodiment of a ceramic package that utilizes a hermetic seal, in accordance with an example implementation of the present disclosure.
Figure 1I:
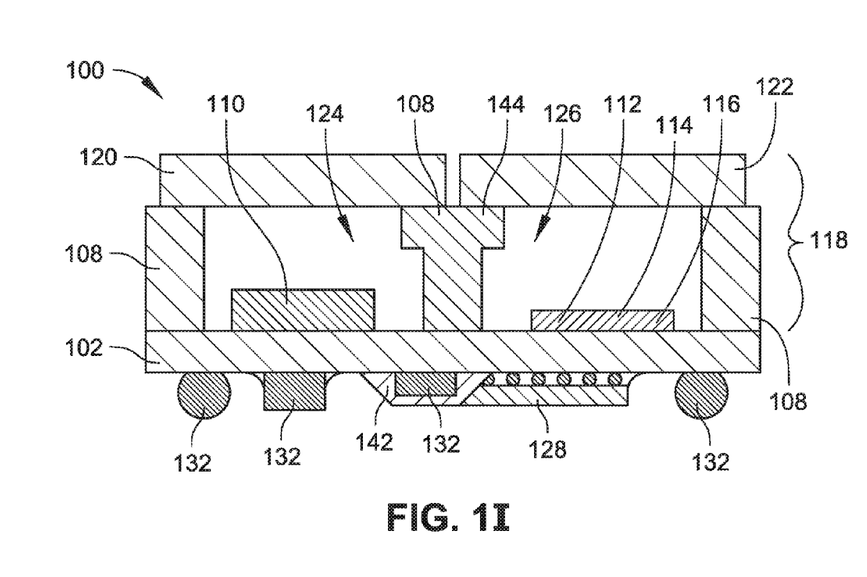
FIG. 1I is a partial side cross-sectional view illustrating an embodiment of a ceramic package with a pre-assembled hat that utilizes a hermetic seal, in accordance with an example implementation of the present disclosure.

In some embodiments, as illustrated in FIG. 1I, the body 108 can include a T-frame 144. A T-frame 144 may include a portion of the body 108 and/or a wall that is configured to provide mechanical support to a lid and/or additional component (e.g., first lid 120, second lid 122, etc.). In the example illustrated in FIG. 1I, a T-frame 144 is disposed as a middle wall of the body 108, where the middle wall of the body 108 partially defines a thermopile cavity 124 and an optical cavity 126. Additionally, the T-frame 144 in this example is configured to provide structural strength to a first lid 120 and a second lid 122. In implementations, the T-frame 144 can be formed as a portion of the body 108 and/or as a portion of a pre-assembled hat 118.

As shown in FIGS. 1A through 1I, the sensor-in-package device 100 may include at least one thermopile 110, a photodetector 112, a light emitting-diode (LED) 114, a UV sensor 116, and/or a resistance temperature detector 138. A thermopile 110 can include can include an electronic device that converts thermal energy into electrical energy and provides a proportional electrical signal for determining an object's temperature. A photodetector 112 can include a device used for detecting light, such as a photodiode. An LED 114 can include a semiconductor light source and can include sources of different wavelengths. A UV sensor 116 can include a sensor and/or photodiode that can detect light in the ultraviolet range. A resistance temperature detector 130 may include a sensor used to measure a temperature by correlating the resistance of the resistance temperature detector 130 with varying temperature. For example, in the specific embodiment shown in FIG. 1A, the sensor-in-package device 100 includes two thermopiles 110 disposed in a thermopile cavity 124 (defined by the substrate 102, the body 108, and a first lid 120) and a photodetector 112, a UV sensor 116, and two LEDs 114 disposed in an optical cavity 126 (defined by the substrate 102, the body 108, and a second lid 122).

Figure 4A:
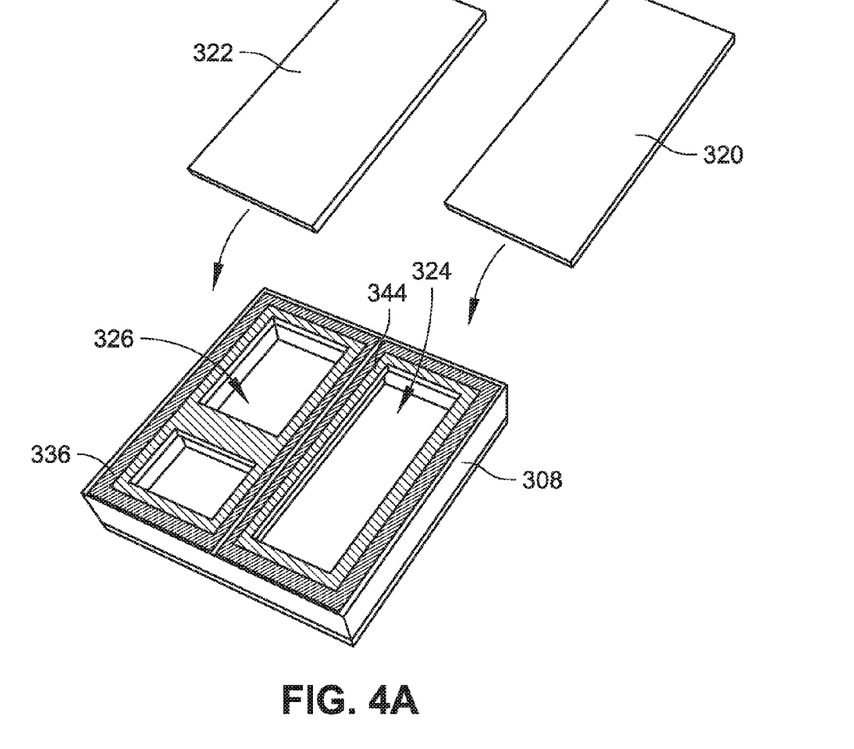
FIG. 4A is an isometric view illustrating the fabrication of a pre-assembled hat used in a ceramic package, such as the ceramic package illustrated in FIGS. 1A through 1I.
Figure 4B:
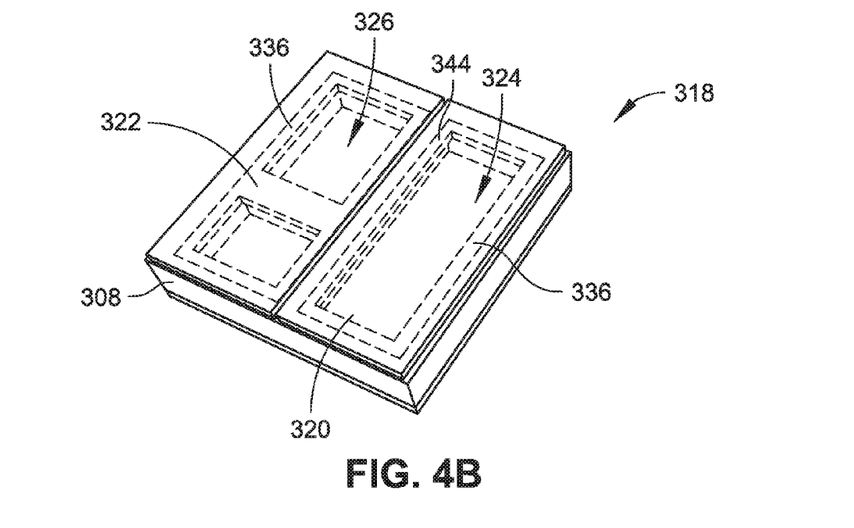
FIG. 4B is an isometric view illustrating the fabrication of a pre-assembled hat used in a ceramic package, such as the ceramic package illustrated in FIGS. 1A through 1I.

In some embodiments, the sensor-in-package device 100 can include a pre-assembled hat 118. As illustrated in at least FIGS. 1I and 4A through 4B, a pre-assembled hat 118, or pre-assembled lid, can include a body 108 with a first lid 120 and second lid 122. The first lid 120 may include a flat or substantially flat piece of silicon, which may be metallized, configured to cover an opening in the sensor-in-package device 100 and at least partially define a thermopile cavity 124. Additionally, the second lid 122 can include a flat or substantially flat piece of glass, which may be metallized, configured to cover an opening in the sensor-in-package device 100 and at least partially define an optical cavity 126. In implementations, the body 108 is formed and the first lid 120 and second lid 122 are placed on and coupled to the body 108 prior to placing the body 108 on a substrate 102. FIG. 4A illustrates a body 108 that has been formed to provide a thermopile cavity 124 and an optical cavity 126, where the first lid 120 and the second lid 122 have not been coupled to the body 108. FIG. 4B illustrates the pre-assembled hat 118 subsequent to coupling the first lid 120 to a portion of the body 108 configured to define the thermopile cavity 124 and coupling the second lid 122 to a portion of the body 108 configured to define the optical cavity 126.

In the embodiment illustrated in FIG. 1B, the sensor-in-package device 100 may include an application-specific integrated circuit (ASIC) 128. In this embodiment, the ceramic package device 100 includes an application specific integrated circuit (ASIC) chip 124 coupled to a side of the sensor-in-package device 100 and/or the substrate 102 opposite the side configured to couple to the pre-assembled hat 118 and/or the at least one thermopile 110. The ASIC chip 124 can be in electrical communication with the other components of the sensor-in-package device 100. In a specific embodiment, the ASIC chip 124 can be coupled to the substrate 102 in a flip-chip configuration using at least one solder connection 132 (e.g., a solder ball array) and/or an underfill. It is contemplated that other ASIC ship 124 configurations may be used (e.g., die-attach using an adhesive, etc.). In some embodiments, the sensor-in-package device 100 can include other devices disposed on the side of the substrate 102 opposite the at least one thermopile 110 and/or the pre-assembled hat 118, such as at least one surface mount device 130 (e.g., a memory chip, a resistor, an LED, etc.) or at least one solder connection 132 configured to couple the sensor-in-package device 100 to another device. In some embodiments, the ASIC chip 124 and/or at least one surface mount device 130 can include an encapsulation structure 142 disposed over and/or around the ASIC chip 124 and/or at least one surface mount device 130 for providing mechanical and/or environmental protection. In a specific example shown in FIG. 1I, an encapsulation structure 142 including an epoxy mold compound is illustrated encapsulating a surface mount device 132.

Example Processes

Figure 2A:
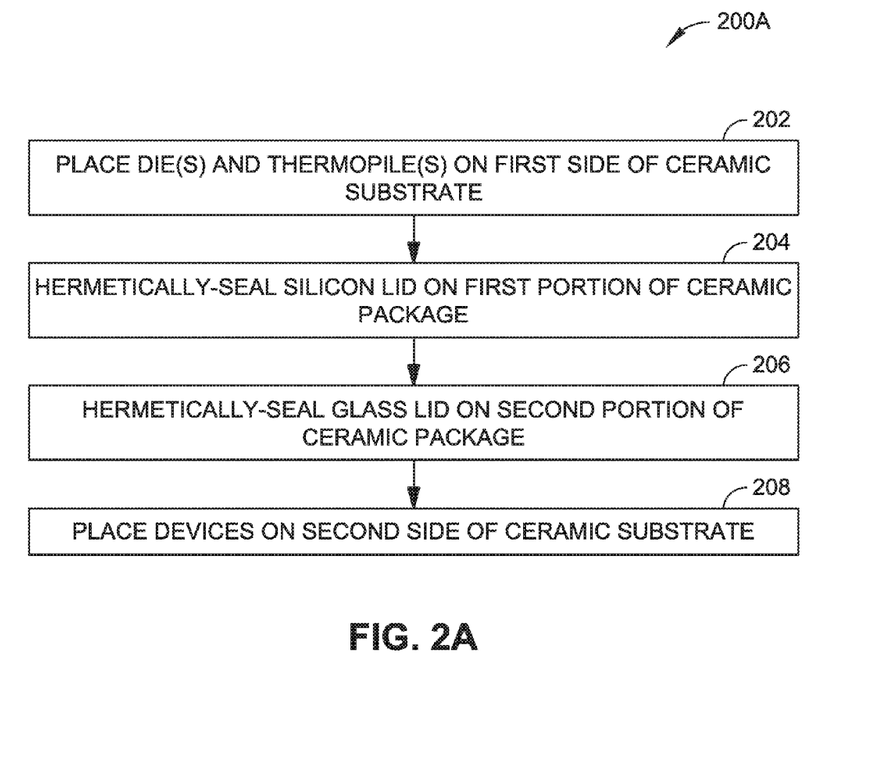
FIG. 2A is a flow diagram illustrating an example process for fabricating a hermetically-sealed ceramic package, such as the ceramic package illustrated in FIGS. 1A through 1I.

FIG. 2A illustrates an example process 200A that employs techniques for fabricating a hermetically-sealed sensor-in-package device, such as the sensor-in-package device 100 shown in FIGS. 1A through 1I. FIGS. 3A through 3D illustrate a section 300 of a hermetically-sealed sensor-in-package device 100 during fabrication.

Figure 3A:
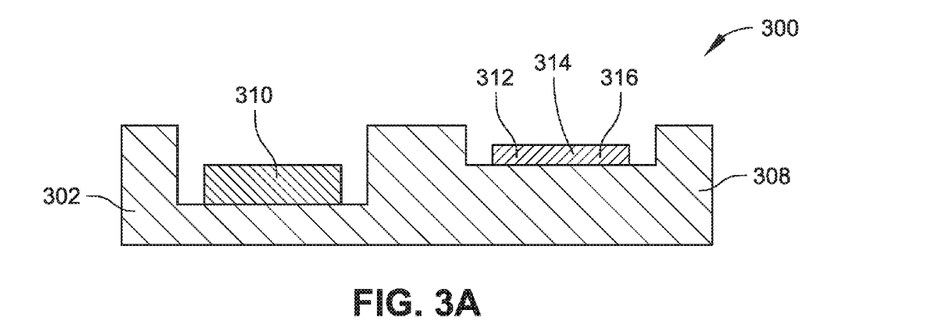
FIG. 3A is a diagrammatic partial cross-sectional view illustrating the fabrication of a hermetically-sealed ceramic package, such as the ceramic package illustrated in FIGS. 1A through 1I, in accordance with the process shown in FIG. 2A.

As shown in FIG. 3A, at least one die and at least one thermopile are placed on a first side of a substrate (Block 202). In implementations, placing at least one die and at least one thermopile 310 on a first side of a substrate 302 can include placing a die (e.g., photodetector 312, light-emitting diode 314, ultraviolet light sensor 316, etc.) and/or thermopile 310 on a side of the substrate 302 configured to be coupled with a ceramic body 308 and/or include a thermopile cavity 324 and optical cavity 326. Placing the thermopile(s) 310 and/or the die can include using a top side die attach and/or wirebonding process to place the thermopile(s) 310 within the thermopile cavity 324 and to place the die within the optical cavity 326. In one specific embodiment, placing the thermopile(s) 310 and/or the die may be performed at approximately 160° C. In embodiments, the substrate 302 can include materials such as ceramic and/or silicon.

Figure 3B:
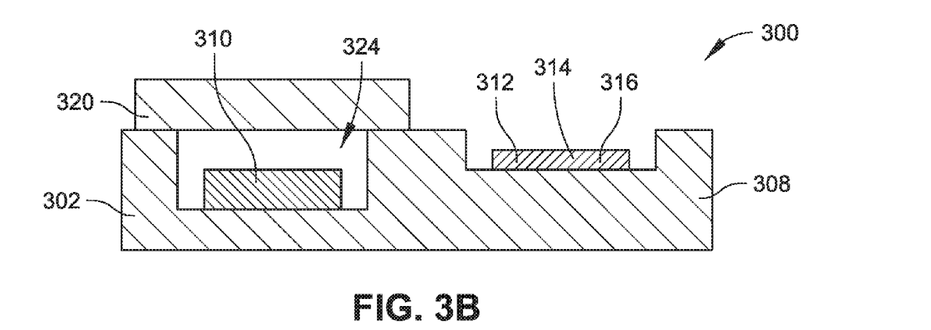
FIG. 3B is a diagrammatic partial cross-sectional view illustrating the fabrication of a hermetically-sealed ceramic package, such as the ceramic package illustrated in FIGS. 1A through 1I, in accordance with the process shown in FIG. 2A.
Figure 3C:
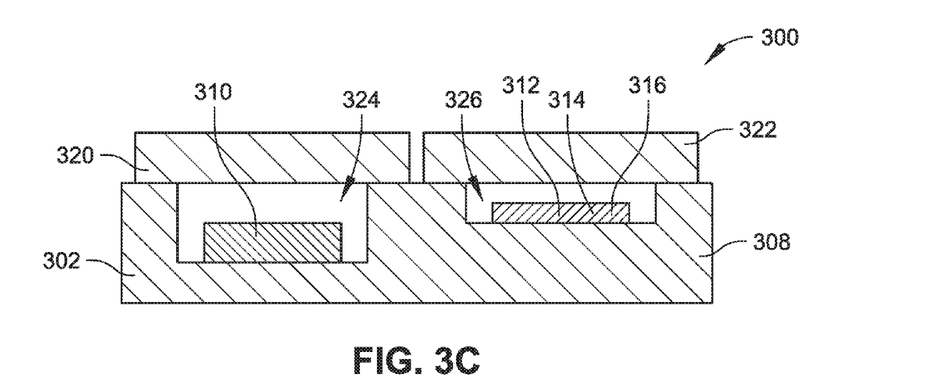
FIG. 3C is a diagrammatic partial cross-sectional view illustrating the fabrication of a hermetically-sealed ceramic package, such as the ceramic package illustrated in FIGS. 1A through 1I, in accordance with the process shown in FIG. 2A.

Shown in FIG. 3B, a silicon lid is hermetically-sealed on a first portion of the ceramic body (Block 204). In implementations, hermetically-sealing the silicon lid 320 on a first portion of the ceramic body 308 can include coupling the silicon lid 320 to a portion the ceramic body 308 including a thermopile cavity 324 configured to house the at least one thermopile 310 and/or a resistance temperature detector 338. Sealing the silicon lid 320 may include heating and/or melting at least a first portion of a metallized track on the ceramic body 308 corresponding to the thermopile cavity 324, where the metallized track serves as the hermetic seal for coupling the silicon lid 320 to the ceramic body 308. In some embodiments, the thermopile cavity 324 sealing can be performed in a vacuum furnace at a temperature of approximately 300° C.

Next, a glass lid is hermetically-sealed on a second portion of the ceramic body (Block 206). In the implementation shown in FIG. 3C, hermetically-sealing the glass lid 322 on a second portion of the ceramic body 308 can include coupling the glass lid 322 to a portion the ceramic body 308 including an optical cavity 326 configured to house at least one die (e.g., photodetector 312, light-emitting diode 314, ultraviolet light sensor 316, etc.). Sealing the glass lid 322 may include heating and/or melting at least a second portion of a metallized track on the ceramic body 308 corresponding to the optical cavity 326, where the metallized track serves as the hermetic seal for coupling the silicon lid 320 to the ceramic body 308. In some embodiments, the thermopile cavity 324 sealing can be performed in a vacuum furnace at a temperature of approximately 300° C.

Figure 3D:
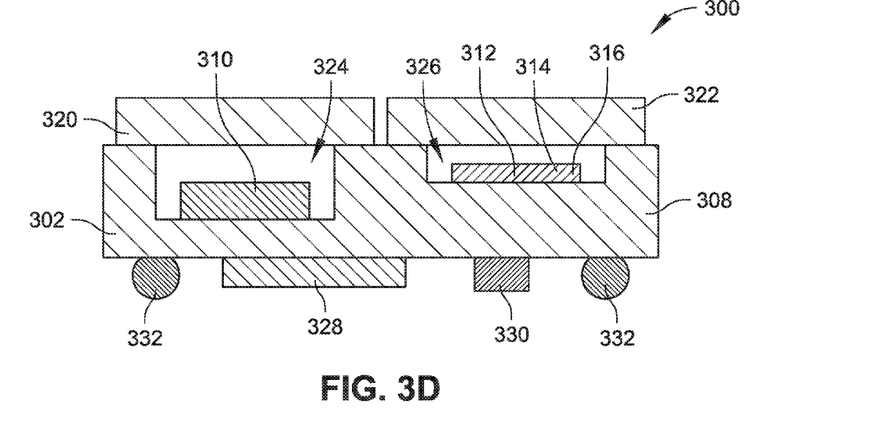
FIG. 3D is a diagrammatic partial cross-sectional view illustrating the fabrication of a hermetically-sealed ceramic package, such as the ceramic package illustrated in FIGS. 1A through 1I, in accordance with the process shown in FIG. 2A.

Then, at least one of a surface mount device, an application-specific integrated circuit, or at least one solder connection is placed on a second side of the ceramic substrate (Block 208). In implementations, placing a surface mount device 330, an application-specific integrated circuit (ASIC) 328, or a solder connection 332 on a second side (e.g., side distal from the at least one thermopile 310 and/or die) of the ceramic substrate 308 may include using a die attach process, solder ball drop, and/or surface mount technologies. For example, the embodiment shown in FIG. 3D illustrates an ASIC 328 in the form of a flip chip coupled to the second side of the ceramic substrate 308 using an adhesive and a die attach process. In another example, an ASIC 328 can be coupled to the second side of the ceramic substrate 308 using an underfill layer and a reflow process with multiple solder connections 132 including a solder ball array. In another example, at least one solder connection 132 may be placed on the second surface of the substrate 302 using a ball drop process, where the at least one solder connection 132 may serve as an electrical connection between the sensor-in-package device 100 and an external device, such as a printed circuit board. In some embodiments, placing at least one of a surface mount device, an application-specific integrated circuit, or at least one solder connection may be performed at approximately 260° C.

Figure 2B:
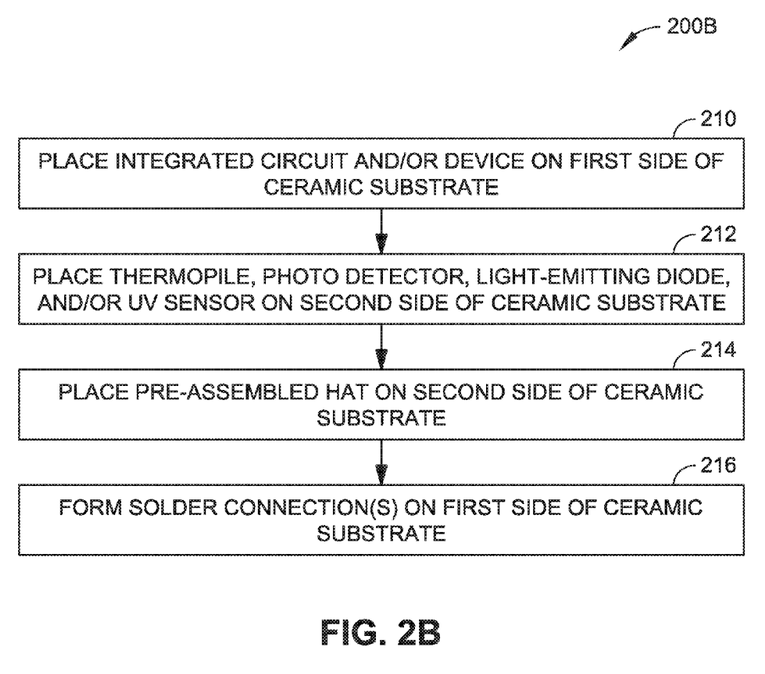
FIG. 2B is a flow diagram illustrating an example process for fabricating a ceramic package with a pre-assembled hat, such as the ceramic package illustrated in FIGS. 1A through 1I.

FIG. 2B illustrates an example process 200B that employs techniques for fabricating a ceramic package with a pre-assembled hat, such as the sensor-in-package device 100 shown in FIGS. 1A through 1I. FIGS. 3E through 3H illustrate a section 300 of a hermetically-sealed sensor-in-package device 100 during fabrication.

Figure 3E:
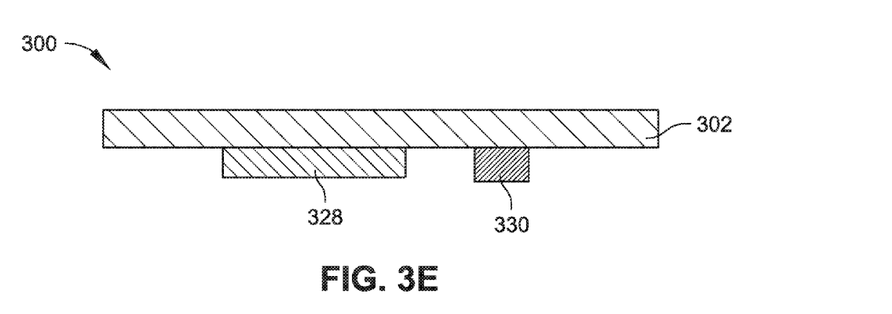
FIG. 3E is a diagrammatic partial cross-sectional view illustrating the fabrication of a ceramic package with a pre-assembled hat, such as the ceramic package illustrated in FIGS. 1A through 1I, in accordance with the process shown in FIG. 2A.

As illustrated in FIG. 3E, at least one of an application-specific integrated circuit or a surface mount device is placed on a first side of a ceramic substrate (Block 210). In implementations, placing a surface mount device 330 and/or an application-specific integrated circuit (ASIC) 328 on a first side (e.g., side distal from the at least one thermopile 310 and/or die) of the ceramic substrate 308 can include using a die attach process and/or surface mount technologies. For example, the embodiment shown in FIG. 3E illustrates an ASIC 328 coupled to the first side of the ceramic substrate 308 using an adhesive and a die attach process. In another example, an ASIC 328 may be coupled to the first side of the ceramic substrate 308 using an underfill layer and a reflow process with multiple solder connections 132 including a solder ball array. In another example, multiple surface mount devices 330 (e.g., two resistors) can be placed, mounted, and/or coupled to the first side of the ceramic substrate 308 using pick-and-place or other surface mount methods. Placing the surface mount device 330 and/or an application-specific integrated circuit (ASIC) 328 may include forming a passivation layer and/or a protective layer (e.g., an encapsulation structure 142) on the substrate 302 and/or the surface mount device 330 and/or the ASIC 328.

Figure 3F:
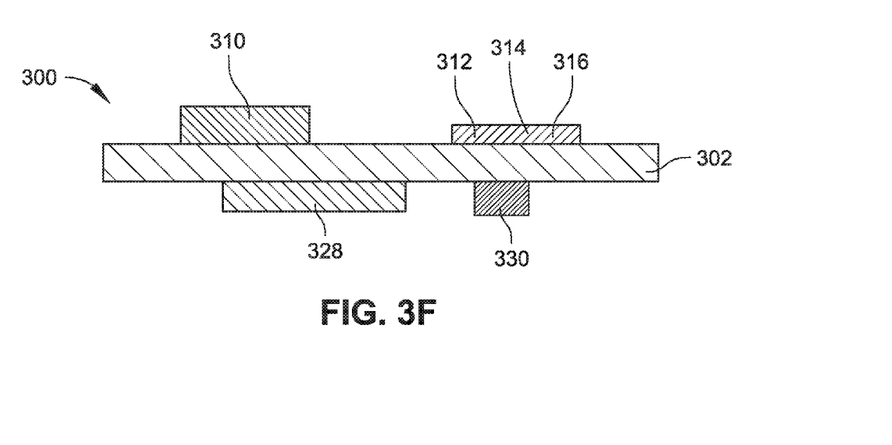
FIG. 3F is a diagrammatic partial cross-sectional view illustrating the fabrication of a ceramic package with a pre-assembled hat, such as the ceramic package illustrated in FIGS. 1A through 1I, in accordance with the process shown in FIG. 2A.
Figure 3G:
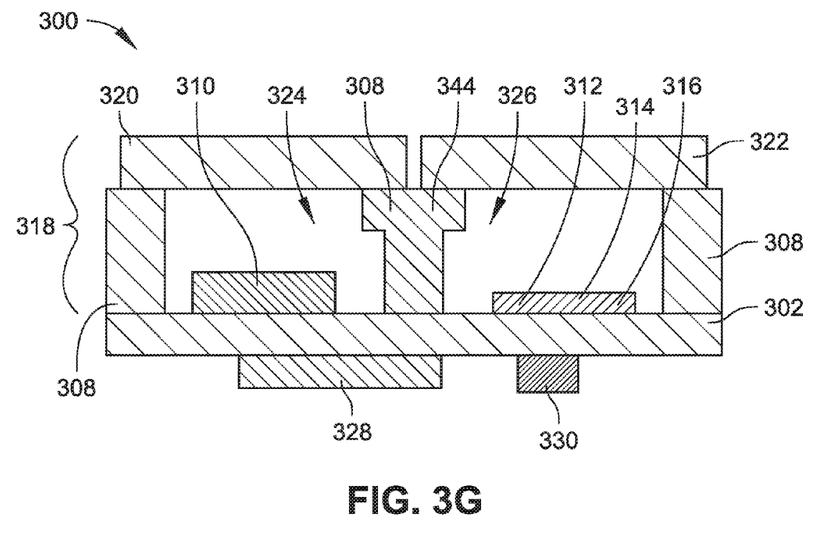
FIG. 3G is a diagrammatic partial cross-sectional view illustrating the fabrication of a ceramic package with a pre-assembled hat, such as the ceramic package illustrated in FIGS. 1A through 1I, in accordance with the process shown in FIG. 2A.

Then, as illustrated in FIG. 3F, at least one of a thermopile, a photodetector, at least one light-emitting diode, or an ultraviolet light sensor is placed on a second side of the ceramic substrate (Block 212). In implementations, placing at least one die and at least one thermopile 310 on a second side (e.g., side distal from the ASIC 328) of a substrate 302 can include placing a die (e.g., photodetector 312, light-emitting diode 314, ultraviolet light sensor 316, all topside components, etc.) and/or thermopile 310 on a side of the substrate 302 configured to be coupled with a ceramic body 308. In one embodiment, the substrate 302 may include a flat or substantially flat substrate. Placing the thermopile(s) 310 and/or the die can include using a top side die attach and/or wirebonding process to place the thermopile(s) 310 on a portion of the substrate 302 configured for a thermopile cavity 324 and to place the die on a portion of the substrate 302 configured for an optical cavity 326. In an embodiment, the substrate 302 may include a metallized track 336 configured to contact a pre-assembled hat 318 and at least partially function as a seal.

A pre-assembled hat is placed on the second side of the ceramic substrate (Block 214). In implementations, placing a pre-assembled hat 318 on the second side of the substrate 302 can include placing the pre-assembled hat 318 on the side of the substrate 302 with the at least one thermopile 310 and/or the at least one die. The pre-assembled hat 318 can include a lid and/or cover that is assembled prior to coupling to the substrate 302. Placing the pre-assembled hat 318 on the substrate 302 may include attaching the pre-assembled hat 318 on the substrate 302 in a vacuum furnace at about 280° C. By placing a pre-assembled hat 318 on the substrate 302 subsequent to placing the at least one thermopile 310 and at least one die on the substrate 302, the existing flat substrate 302 can be utilized to achieve a hermetic seal and an optical solution in one process step. Multiple sensing functionality can be integrated into a single package with a smaller form factor. In one specific embodiment, placing the pre-assembled hat 318 may include placing a pre-assembled hat 318 including a ceramic body 308 having at least one wall that includes a T-frame 344. In the embodiment illustrated in FIGS. 3G and 3H, the pre-assembled hat 318 including a ceramic body 308 includes a middle wall (e.g., configured to separate a thermopile cavity 324, an optical cavity 326, and/or a second optical cavity) with a T-frame 344 configuration, where the T-frame 344 configuration can serve to structurally support another component of the sensor-in-package device 100, such as a silicon lid 320 and/or a glass lid 322. In an implementation, as shown in FIGS. 4A and 4B, pre-assembling a pre-assembled hat 318 can include forming a ceramic body 308, forming a metallized track 336 on a portion of the ceramic body 308 that is configured to contact a substrate 302, a silicon lid 320, and/or a glass lid 322, and placing the silicon lid 320 and/or the glass lid 322 on the ceramic body 308.

Figure 3H:
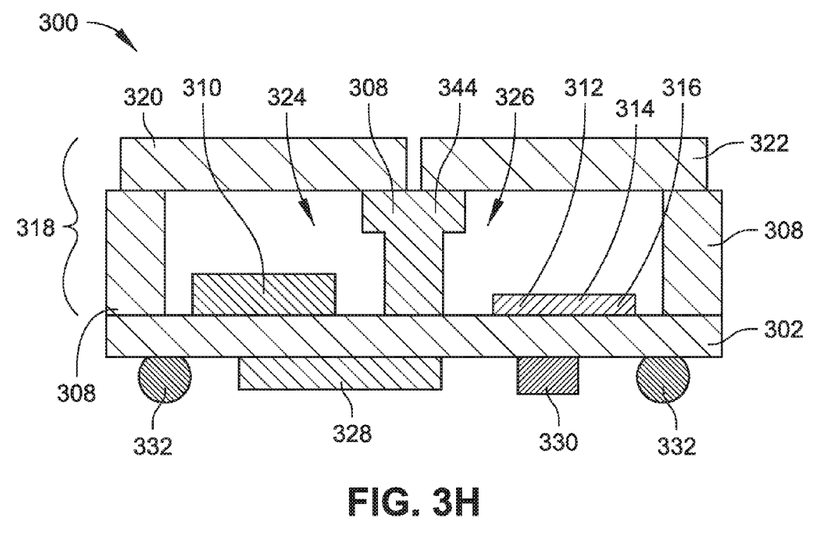
FIG. 3H is a diagrammatic partial cross-sectional view illustrating the fabrication of a ceramic package with a pre-assembled hat, such as the ceramic package illustrated in FIGS. 1A through 1I, in accordance with the process shown in FIG. 2A.

As shown in FIG. 3H, at least one solder connection is formed on the first side of the ceramic substrate (Block 216). In implementations, forming at least one solder connection can include forming the solder connection(s) on the side of the substrate 302 including the ASIC 328 and/or the at least one surface mount device 330. A process, such as a ball drop process using flux and a stencil may be utilized. It is contemplated that other processes for forming at least one solder connection 332 may be utilized. Additionally, forming at least one solder connection 332 may include forming multiple sizes of solder connections 332. In an embodiment, the at least one solder connection 332 may be reflowed at a temperature of about 260° C. Further, the sensor-in-package device 100 and/or the substrate 302 may then be singulated to form an individual sensor package.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A sensor-in-package device, comprising:
  a substrate having a first side and a second side;
  at least one thermopile disposed on the first side of the substrate;
  at least one photodetector disposed on the first side of the substrate;
  at least one light-emitting diode disposed on the first side of the substrate;
  an ultraviolet light sensor disposed on the first side of the substrate; and
  a pre-assembled hat disposed on the first side of the substrate, where the pre-assembled hat includes
    a body;
    a first lid; and
    a second lid;
  where the body, the substrate, and the first lid define a thermopile cavity that houses the at least one thermopile, and where the body, the substrate, and the second lid define an optical cavity that houses at least one of the at least one photodetector, the at least one light-emitting diode, or the ultraviolet light sensor.

2. The sensor-in-package device in claim 1, wherein the substrate is a ceramic substrate.

3. The sensor-in-package device in claim 1, where the pre-assembled hat includes a ceramic body.

4. The sensor-in-package device in claim 1, where the first lid includes a silicon lid.

5. The sensor-in-package device in claim 1, where the second lid includes a glass lid.

6. The sensor-in-package device in claim 5, wherein the glass lid includes a metallized glass lid.

7. The sensor-in-package device in claim 1, where the pre-assembled hat includes a metallized track disposed between the ceramic body and at least one of the silicon lid or the glass lid.

8. The sensor-in-package device in claim 1, wherein the thermopile cavity includes a hermetic seal.

9. The sensor-in-package device in claim 1, wherein the optical cavity includes a hermetic seal.

10. The sensor-in-package device in claim 9, further comprising:
  a second hermetically-sealed optical cavity that includes a light-emitting diode.

11. The sensor-in-package device in claim 1, further comprising:
  at least one of an application-specific integrated circuit coupled to the second side of the ceramic substrate, a surface mount device coupled to the second side of the ceramic substrate, or at least one solder connection coupled to the second side of the ceramic substrate.

12. A process for fabricating a hermetically-sealed sensor-in-package device, comprising:
placing at least one die and at least one thermopile on a first side of a ceramic substrate in the ceramic package, where the ceramic package includes a ceramic body and the ceramic substrate;
hermetically-sealing a silicon lid on a first portion of the ceramic body, where the ceramic body, the ceramic substrate, and the silicon lid define a hermetically-sealed thermopile cavity that houses the at least one thermopile;
hermetically-sealing a glass lid on a second portion of the ceramic body, where the ceramic body, the ceramic substrate, and the glass lid define a hermetically-sealed optical cavity that houses the at least one die; and
placing at least one of at least one surface mount device, an application-specific integrated circuit, or at least one solder connection on a second side of the ceramic substrate.

13. The process for fabricating a hermetically-sealed sensor-in-package device in claim 12, where the at least one die includes at least one of a photodetector, an ultraviolet light sensor, or a light-emitting diode.

14. The process for fabricating a hermetically-sealed sensor-in-package device in claim 12, wherein the glass lid includes a metallized glass lid.

15. The process for fabricating a hermetically-sealed sensor-in-package device in claim 12, wherein a metallized track is disposed between the ceramic body and at least one of the silicon lid or the glass lid.

16. A process for fabricating a hermetically-sealed sensor-in-package device with a pre-assembled hat, comprising:
placing at least one of an application-specific integrated circuit or a surface mount device on a first side of a ceramic substrate;
placing at least one of at least one thermopile, at least one photodetector, at least one light-emitting diode, or an ultraviolet light sensor on the second side of the ceramic substrate;
placing the pre-assembled hat on the second side of the ceramic substrate using a vacuum furnace, where the pre-assembled hat includes
a ceramic body;
a silicon lid disposed on a first portion of the ceramic body, where the silicon lid, the ceramic body, and the ceramic substrate form a hermetically-sealed thermopile cavity; and
a glass lid disposed on a second portion of the ceramic body, where the silicon lid, the ceramic body, and the ceramic substrate form a hermetically-sealed optical cavity; and
forming at least one solder connection on the first side of the ceramic substrate.

17. The process for fabricating a hermetically-sealed sensor-in-package device with a pre-assembled hat in claim 16, wherein the glass lid includes a metallized glass lid.

18. The process for fabricating a hermetically-sealed sensor-in-package device with a pre-assembled hat in claim 16, wherein a metallized track is disposed between the ceramic body and at least one of the silicon lid or the glass lid.

19. The process for fabricating a hermetically-sealed sensor-in-package device with a pre-assembled hat in claim 16, where the at least one solder connection includes an array of solder balls.

20. The process for fabricating a hermetically-sealed sensor-in-package device with a pre-assembled hat in claim 16, further comprising:
singulating the ceramic substrate to form individual sensor-in-package devices.

* * * * *